United States Patent [19]

Chen et al.

[11] Patent Number: 5,399,415
[45] Date of Patent: Mar. 21, 1995

[54] ISOLATED TUNGSTEN MICROELECTROMECHANICAL STRUCTURES

[75] Inventors: Liang-Yu Chen; Noel C. MacDonald, both of Ithaca, N.Y.

[73] Assignee: Cornell Research Foundation, Inc., Ithaca, N.Y.

[21] Appl. No.: 71,260

[22] Filed: Jun. 4, 1993

Related U.S. Application Data

[63] Continuation-in-part of Ser. No. 15,539, Feb. 5, 1993, abandoned.

[51] Int. Cl.[6] .............................................. B32B 9/00
[52] U.S. Cl. ...................................... 428/209; 428/210; 310/40 MM; 310/309
[58] Field of Search ................... 428/209, 210, 704; 310/309, 310 MM, 62, 112, 306; 257/721; 336/200; 156/630

[56] References Cited

U.S. PATENT DOCUMENTS

| | | | |
|---|---|---|---|
| 4,437,226 | 3/1984 | Soclof | 29/577 |
| 4,668,865 | 5/1987 | Gimzewski et al. | 250/306 |
| 4,706,374 | 11/1987 | Murakami | 437/225 |
| 4,746,621 | 5/1988 | Thomas et al. | 437/24 |
| 4,772,928 | 9/1988 | Dietrich et al. | 73/517 R |
| 4,845,048 | 7/1989 | Tamaki et al. | 437/62 |
| 5,015,906 | 5/1991 | Cho | 310/309 |
| 5,045,152 | 9/1991 | Sickafus | 156/653 |
| 5,070,317 | 12/1991 | Bhagat | 336/200 |
| 5,072,288 | 12/1991 | MacDonald | 310/309 |
| 5,126,812 | 6/1992 | Greiff | 357/26 |
| 5,179,499 | 1/1993 | MacDonald | 156/630 |
| 5,206,557 | 4/1993 | Bobbio | 310/309 |

FOREIGN PATENT DOCUMENTS

62-232171 12/1987 Japan .
63-136982 9/1988 Japan .

OTHER PUBLICATIONS

Wilson, Stoll and Calacone, "Highly Selective, High Rate Tungsten Deposition", 1985, pp. 35–42.
Zhang et al., "An RIE Process for Submicron, Silicon Electromechanical Structures", 1991, pp. 520–523.
Moriya et al., "A Planar Metallization Process—Its Application to . . . ", Jul. 1983, pp. 550–553.
Arney et al., "Formation of Submicron Silicon-on-Insulator . . . ", J. Vac. Sci. Technol. B 6(1), Jan./Feb. 1988, pp. 341–345.
Wilson et al., "Highly Sensitive, High Rate Tungsten Deposition", Materials Research Society, 1985, pp. 35–42.
Zhang et al., "A RIE Process for Submicron, Silicon Electromechanical Structures", J. Micromech. Microen. 2 (1992) 31–38.

*Primary Examiner*—Patrick J. Ryan
*Assistant Examiner*—Patrick Jewik
*Attorney, Agent, or Firm*—Jones, Tullar & Cooper

[57] ABSTRACT

A process for fabricating mechanically interconnected, released, electrically isolated metal microstructures, and circuit components and actuators produced by the process. A dielectric stack on a substrate is patterned and etched to produce trenches in which a metal such as tungsten is deposited. The dielectric is removed from selected regions of the metal to expose metal beams, and to form mechanically interconnecting, electrically insulating hinges supporting the beams. The beams and hinges are then released for relative motion. Electrical potentials may be established between adjacent beams to produce controlled motion.

26 Claims, 6 Drawing Sheets

ISOLATED TUNGSTEN MICROELECTROMECHANICAL STRUCTURES

This is a continuation-in-part of U.S. application Ser. No. 08/015,539, of Liang-Yu Chen et al, filed Feb. 5, 1993, now abandoned, and assigned to the assignee of the present application.

BACKGROUND OF THE INVENTION

This invention was made with Government support under Grant No. DABT 63-92-C-0019 awarded by DARPA, and Grants Nos. ECS-8805866 and ECS-8815775 awarded by the National Science Foundation. The Government has certain rights in the invention.

The present invention is directed to a method for fabricating isolated, joined microelectromechanical (MEM) structures and to tungsten structures fabricated by that method. More particularly, the invention is directed to a novel isolation technology utilizing a selective chemical vapor deposition of tungsten whereby released tungsten structures are fabricated which are both mechanically joined and electrically isolated by a dielectric.

Recent developments in microelectromechanical processes have successfully led to the fabrication of microactuators utilizing processes which have involved bulk or surface micromachining. The most popular surface micromachining process has used polysilicon as the structural layer in which the mechanical structures are formed. In a typical polysilicon process, a sacrificial layer is deposited on a silicon substrate prior to the deposition of the polysilicon layer and mechanical structures are then defined in the polysilicon. The sacrificial layer is then etched partially or completely down to the silicon substrate to free the polysilicon structures.

In bulk micromachining, a silicon substrate is etched and sculpted to leave a structure. This typically has been done using wet chemical etchants to undercut single crystal silicon structures from a silicon wafer. However, such processes are dependent on the crystal orientation within the silicon substrate, and the process is difficult to control. A dry bulk micromachining process which utilizes thermolateral oxidation to completely isolate islands of single crystal silicon is also available for the fabrication of submicron, single crystal silicon movable mechanical structures.

Microactuators produced by the foregoing processes have a biased, movable, released structure, for example in the form of one or more beams or plates which are electrostatically driven by nearby electrodes. Such electrodes may consist of parallel plates adjacent the released structure or may consist of comb-shaped capacitive drive actuators as illustrated, for example, in U.S. Pat. No. 5,179,499 of Noel C. MacDonald et al.

The use of electrodes such as parallel plates or surfaces adjacent movable structures for controlling or sensing the motion thereof is illustrated, for example, in U.S. Pat. No. 5,072,288, issued Dec. 10, 1991 and in U.S. patent application Ser. No. 07/868,138, entitled "Methods of Fabricating Integrated Aligned Tunneling Tip Pairs" of Noel C MacDonald, filed Apr. 14, 1992 and assigned to the assignee of the present application. Comb drives, utilizing interdigitated capacitive plates, are also illustrated in the '138 application. The foregoing patents and application are exemplary of methods for producing microelectromechanical structures and of the structures so produced.

In U.S. Pat. No. 5,179,499, adjacent movable plates are driven by a selected potential applied thereacross to produce relative axial motion between the plates. This microstructure has been found to be extremely useful in controlling the motion of microstructures, including impedances, switches, sensing tips and the like. However, the process utilized to fabricate such a structure involves the formation of released structures in a silicon substrate and then covering such released structures with layers of dielectric material and metal. It is desirable to fabricate such devices in wafers for connection to integrated circuits and to allow incorporation of such devices in different levels of such circuits, and for this purpose it has been found desirable to make the movable structure from tungsten.

U.S. Pat. No. 4,746,621 of David C. Thomas et al, assigned to the assignee of the present application, describes a selective tungsten on silicon process for use in producing patterned integrated circuit metal layers. Patterned CVD silicon dioxide trenches are ion implanted with silicon to permit the fabrication of tungsten microstructures. However, to enable the use of tungsten beams in actuators of the type disclosed in the '499 patent described above, and to allow selective movement of such actuators, it is necessary to provide electrical isolation of the mechanical components and to provide selective biasing of the structure, and for this purpose it is necessary to provide a process by which the microelectromechanical structures can be both mechanically interconnected and electrically isolated, whereby they can be integrated into the surrounding circuitry.

SUMMARY OF THE INVENTION

It is, therefore, an object of the present invention to provide electrically isolated, released microelectromechanical structures of tungsten.

It is another object of the invention to provide mechanically joined but electrically isolated tungsten microstructures.

It is another object of the invention to provide a process for fabricating microelectromechanical structures and for joining such structures mechanically while maintaining electrical isolation therebetween.

Another object of the invention is to provide a three-mask isolation process for fabricating tungsten structures in a substrate material.

A still further object of the invention is to provide a tungsten microactuator having parallel beams mechanically interconnected but electrically isolated.

In general, the invention is directed to a process for fabricating released microstructures which are electrically isolated but which are hinged or otherwise joined to each other for mechanical support and relative motion while retaining their electrical isolation. Hinges or joints are provided between relatively movable structures, and are fabricated from a dielectric material such as silicon nitride or a combination of silicon nitride with silicon carbide, while the structures, or beams, are of tungsten. The silicon nitride provides the electrical isolation that is essential for integrated microelectromechanical structures and which permits selective biasing of each mechanical component for accurate control of the actuator motion. Such isolation also increases the ability to mechanically couple off-chip actuators with on-chip structures. Silicon carbide is used as a top cap layer for the nitride for its high resistance to the etchants used in the fabrication process and for its mechanical strength.

A three-mask isolation process is used, in accordance with the present invention, which can be applied to a wide range of devices. A highly planar selective CVD tungsten process enables fabrication of silicon nitride or silicon dioxide hinges to join and to isolate released, conducting tungsten structures, with a plasma-enhanced chemical vapor deposition (PECVD) process being used to deposit amorphous silicon carbide as a top layer on the silicon nitride or silicon dioxide. Selective tungsten possesses unique mechanical properties, and the process by which released structures are fabricated is compatible with silicon integrated circuit processes to enable fabrication of multi-level mechanical devices incorporating movable structures in any selected layer. A key characteristic of the process is the achievement of a planar surface after the formation of the microstructures.

In one embodiment of the invention, the starting material may be a p-type silicon wafer with a 0.5 $\mu$m low stress nitride layer to insure insulation between the substrate and the released tungsten structures to be fabricated. A layer of low temperature CVD silicon dioxide approximately 4.0 $\mu$m thick is deposited as a structural support layer for a silicon nitride layer which forms the mechanical connectors, or hinges, which are used to interconnect the tungsten structures and to electrically isolate them. The nitride/silicon dioxide composite layer is patterned, and trenches for the tungsten structures are formed by reactive ion etching the composite dielectric layer, the trenches being etched to a depth of approximately 3 $\mu$m to leave a sacrificial layer of oxide at the bottom of the trenches.

After the resist material is removed from the surface of the wafer, the surface of the trench floor is made silicon or metal-rich by using ion implantation of silicon atoms or by evaporation of metals such as gold or palladium. A tungsten film is then selectively deposited to fill the silicon or metal-enriched trenches. Thereafter, a 0.5 $\mu$m PECVD layer or a 0.4 $\mu$m PECVD amorphous silicon carbide layer is deposited on top of the wafer so that the tungsten structures are surrounded by a side wall nitride, and a top wall of nitride or carbide. A second mask is then used to expose tungsten contact pads formed during the deposition of the tungsten film.

Finally, an isolation resist mask is applied to define the isolation and non-isolation regions in the nitride or nitride/carbide layer surrounding the tungsten, and these layers are etched to define nitride or nitride/carbide isolation hinges which consist of silicon nitride or silicon carbide on the top walls and silicon nitride on the side walls of the tungsten structures and extending therebetween in selected regions to mechanically connect but electrically isolate the tungsten. The foregoing process permits tungsten structures of a wide variety of shapes and dimensions to be mechanically interconnected but released from the surrounding substrate for motion.

An example of a structure which can be fabricated utilizing the foregoing process is in the form of what may be referred to as a "muscle fiber" wherein the tungsten structure consists of a pair of released tungsten beams which are parallel to each other, are spaced apart, and are mechanically joined at opposite ends by released silicon nitride or nitride/carbide supports, or hinges. Because the released beams are electrically conductive, but are electrically isolated by the end supports, or hinges, the beams can be individually electrically biased, with opposite voltages applied to each beam of the pair. Such a potential produces a capacitive effect between the beams which, depending upon the polarity of the applied potential, either attracts or repels the opposed tungsten structures and causes them to move toward or away from each other. Thus, a pair of opposed spaced conductive beams forming a capacitor can act as a controlled muscle fiber to contract and release upon application of selected potentials. A plurality of such units can be fabricated in series relationship so that their cumulative movements in response to the application of a voltage providing large scale motion, with each unit being separately biased to provide precise control of the motion.

Various other movable structures such as microtweezers, microgrippers, beams, capacitor plates, switches, inductors, and the like, can be fabricated utilizing the foregoing actuator structure, with the relatively movable released beams being constructed of tungsten. Because the tungsten material is compatible with the manufacture of multi-level integrated circuits, such actuators can be fabricated in any selected level of such a circuit. Furthermore, because the fabrication process does not rely upon the material of the substrate, the tungsten beam can be constructed on any desired substrate material.

BRIEF DESCRIPTION OF THE DRAWINGS

The foregoing, and additional objects, features, and advantages of the present invention will become apparent to those of skill in the art from a more detailed consideration of preferred embodiments thereof, taken in conjunction with the following drawings, in which:

FIGS. 4A–6A are diagrammatic illustrations of a second embodiment of the process of FIGS. 1–6;

DESCRIPTION OF PREFERRED EMBODIMENTS

The basic process for producing mechanically released, electrically isolated hinged or joined micromechanical structures is illustrated in FIGS. 1 through 6. This process is based on the selective tungsten CVD technology described in U.S. Pat. No. 4,846,621, but uses additional processing steps, as will be described. The process begins with a substrate 10 which, for example, may be a 3-inch p-type silicon wafer. A silicon nitride layer 12 is placed on the wafer to provide insulation between the substrate and the released tungsten structures. Preferably, layer 12 is about 0.5 $\mu$m thick. A layer 14 of low temperature CVD silicon dioxide approximately 4.0 $\mu$m thick is then placed on the top surface of layer 12 to provide a support for the isolation hinges. Thereafter, a silicon nitride layer 16 is placed on the top surface of layer 14 for use as an implantation mask and to provide the isolation hinges. The layers 14 and 16 form a composite dielectric layer.

Figure 1:
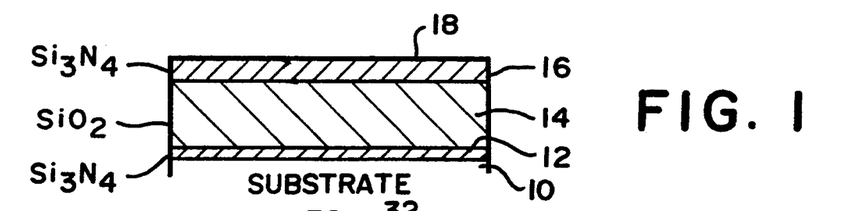
FIGS. 1–6 are diagrammatic illustrations of a first process for fabricating released, mechanically connected, electrically isolated metal microstructures.

To form the tungsten structure, which can be of any desired shape, but which for convenience will be here illustrated and referred to as structural beams, a photoresist layer (not shown) is spun on the top surface 18 of layer 16, is exposed, and is developed in conventional manner to define a pattern for channels, or trenches, in which the tungsten beams are to be formed and in which various interconnect lines and connector pads can also be formed. A contrast enhancing material layer (not shown) is used with the photoresist for patterning to obtain vertical resist profiles.

After patterning, a plurality of trenches, for example trenches 21 through 23 are formed by reactive ion etching (RIE), layers 14 and 16 in a CHF$_3$ ambient. The trenches 20 through 23 are etched to a depth of approximately 3.0 $\mu$m so that the bottom surfaces, or floors 26 through 29 respectively, of the trenches 20 through 23 are spaced above the top surface of layer 12 by about 2 $\mu$m. The channels 20 through 23 preferably are parallel to each other, but they may diverge or converge slightly, or may take other configurations, as desired, the channels serving as molds for the tungsten beams which are to be fabricated.

Figure 2:
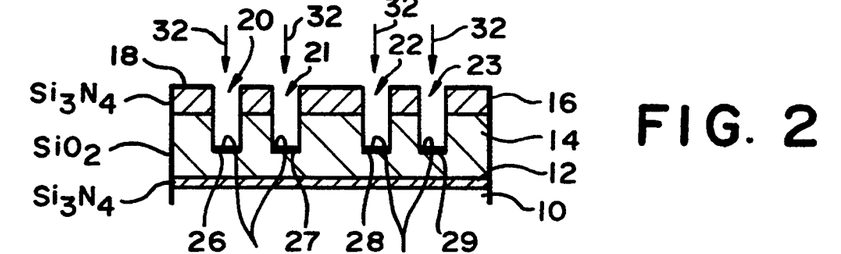

After the resist is removed from the top surface of layer 16, as by an oxygen plasma etch step, the bottom surfaces or floors 26 through 29 of trenches 20 through 23, respectively, are made silicon-rich or metal-rich by ion implantation of silicon atoms at an energy of, for example, 40 KeV, as illustrated by the arrows 32 in FIG. 2, or by evaporation of metals such as gold or palladium. This step produces an implantation or metal seed layer 32 in the bottom of each of channels 20 through 23 as well as on the top surface 18 of silicon nitride layer 16. In the case of silicon implantation, the silicon atoms are implanted at a dosage sufficient to initiate seeding of tungsten in the subsequent deposition step. A silicon dosage of about $1 \times 10^{17}$ per square centimeter has been found to be sufficient to initiate the deposition of tungsten on silicon dioxide. The wafer is then subjected to an oxygen plasma to remove any carbon contamination encountered during the implantation. To expose the peak silicon concentration in the implanted oxide channels, buffered HF is used.

If it is desired to cover the bottoms 26 through 29 of the trenches with a metal seed layer, a standard lift off process is used to limit evaporation to these locations. Another alternative to the implantation of silicon is the implantation of a polysilicon material; however, the use of silicon is preferred.

Figure 3:
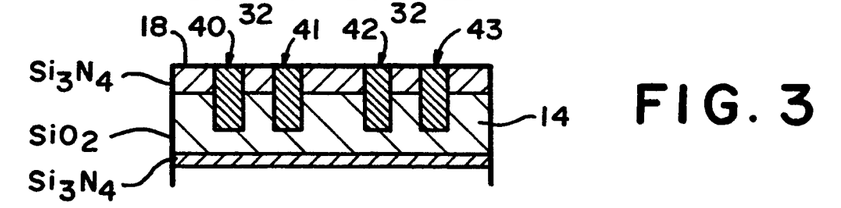

As illustrated in FIG. 3, a tungsten film is selectively deposited, using, for example, a Genus 8432 cold wall reactor at a temperature of 550° C., to fill the silicon or metal-enriched trenches 20 to 23, producing tungsten beam structures 40 through 43. The seed layer 32 at the bottom of each of the channels 20 through 23 facilitates the selective deposition of the tungsten, since tungsten does not adhere to dielectric oxides and thus will not adhere to the top surface 18 of the layer 16. The tungsten provides the structures 40 through 43, with the walls of the channels providing molds for shaping the tungsten beams. Preferably, the tungsten fills the channels completely so that the top surfaces of the tungsten beams are level with the surface 18 to provide a planar wafer surface.

The deposited tungsten typically has a granular, rough surface which may make it difficult to planarize the top surface. Accordingly, as an option it may be desirable to mechanically polish the top surface 18 and the tops of structures 40-43, thereby providing a smooth top surface.

Figure 4:
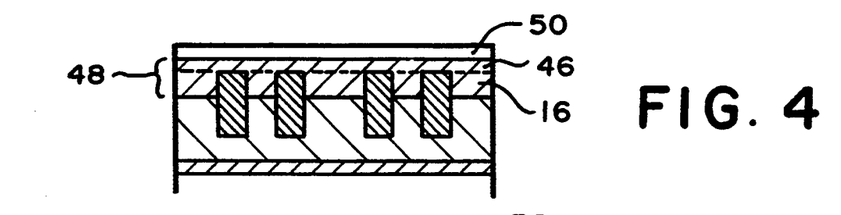

In order to complete the mechanical connectors, or hinges, which will interconnect the tungsten beams after they are released, a PECVD nitride layer 46 is added to the top surface 18 of the wafer, covering the tops of beams 40 to 43. This additional layer is approximately 0.5 $\mu$m thick and is added to the previous nitride layer 16 to produce a combined nitride layer 48. As a result, as illustrated in FIG. 4, the tungsten structures 40 to 43 are surrounded by a top and partial side wall nitride layer; the nitride does not cover the bottoms of these structures because they are formed in the silicon dioxide layer 14.

A second resist layer 50 is then applied, exposed and developed to provide a mask for etching the PECVD nitride layer 46 in order to produce vias in areas where contact pads and interconnect lines are required for the tungsten structures 40 to 43, as would usually be the case when the device is being fabricated on an integrated circuit wafer. The pads and interconnects are exposed by RIE etching of the nitride layer.

Figure 5:
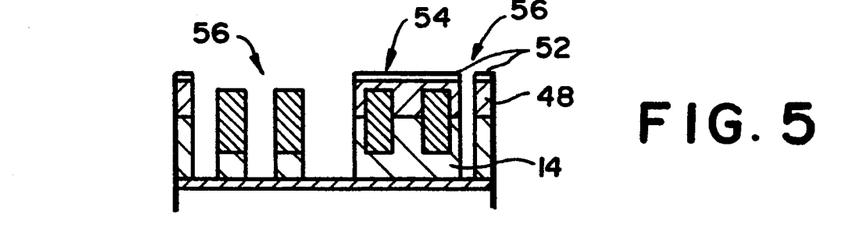
Figure 6:
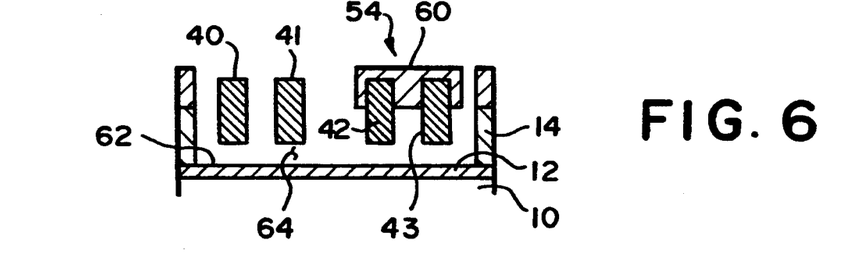

Finally, an isolation resist layer 52 is applied, exposed and developed to define an isolation resist mask which is applied to define the locations of isolation hinges which are to mechanically join, but electrically isolate selected released tungsten structures. As illustrated in FIG. 5, mask 52 selectively covers a hinge region 54 while exposing a non-hinge region 56 on the wafer. A dry RIE anisotropic etch in a CHF$_3$ plasma is used to remove silicon nitride from the region 56 but leaving nitride in masked areas to thereby define the nitride isolation hinge in the region 54. Thereafter, utilizing the same mask 52, the silicon dioxide layer 14 in the region 56 is etched, using a wet 6:1 BHF etchant. This etchant continues, as illustrated in FIG. 6, to remove the silicon dioxide under the tungsten structures 40 and 41 in region 56 as well as under the structures 42 and 43 in the region 54, thereby releasing the tungsten beams. The top and side wall nitride in the region 54 is not affected by the BHF etchant so that the nitride remains after the silicon dioxide layer 14 has been removed. Accordingly, as illustrated in FIG. 6, beams 40 and 41 are separately released, while beams 42 and 43 are released from the substrate 10 but are tied together by the nitride material in the region 54 which forms a hinge 60. This hinge mechanically joins beams 42 and 43, while retaining the electrical isolation between them. It is noted that the nitride layer 12 also remains unaffected by the silicon dioxide etch, acting as an etch stop to form the floor 62 of a trench, generally indicated at 64, which surrounds the released beams.

In a modification of the foregoing process, plasma-enhanced chemical vapor deposition (PECVD) of amorphous silicon carbide ($SI_xC_{1-x}H_y$) is added as a top-cap layer in conjunction with silicon nitride for the isolating supports, or hinges. Silicon carbide has a high etch resistance to buffered HF etchant, and in addition has a high electrical breakdown strength ($3 \times 10^6$ V/cm) which is important for isolation of the tungsten beams.

Figure 4A:
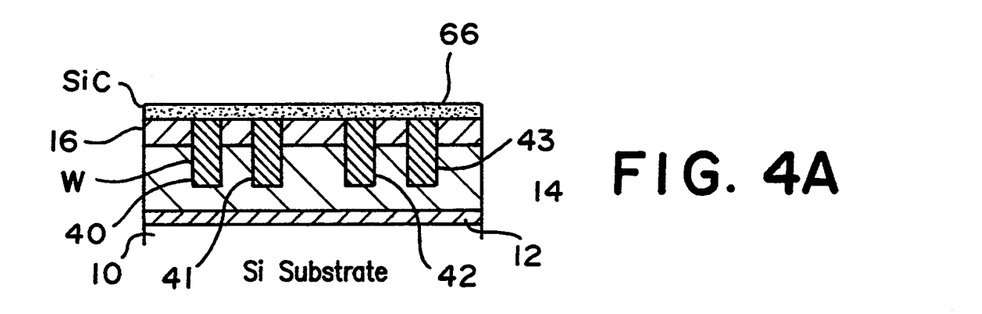
Figure 5A:
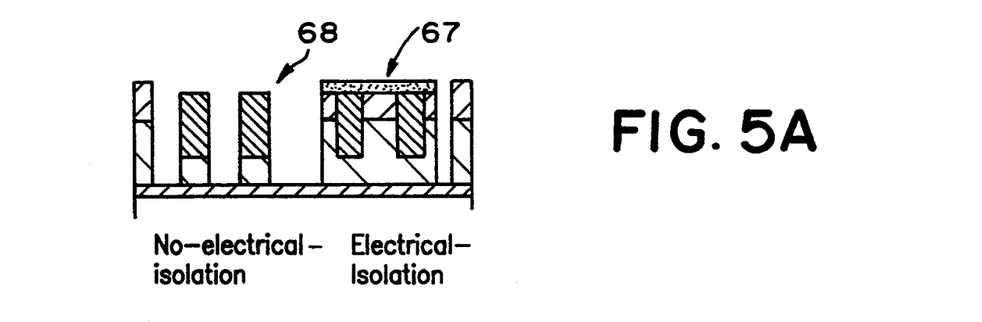
Figure 6A:
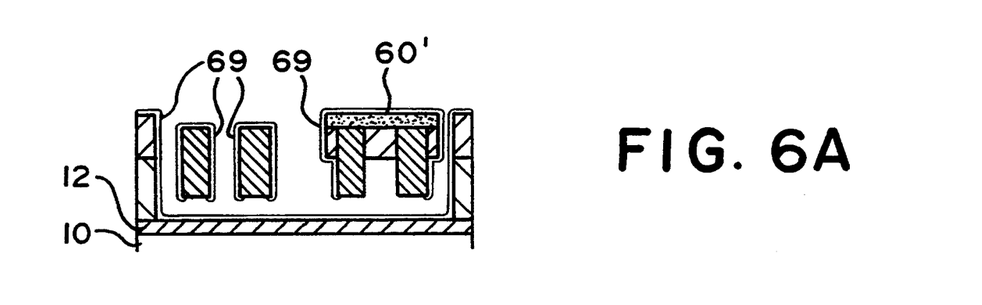

The process for fabricating an actuator with SiC hinges follows the process of FIGS. 1-3, described above, to provide tungsten structures such as beam 40-43 in trenches. Thus, a layer of low temperature CVD silicon dioxide approximately 4.0 $\mu$m thick is covered with a 1.0 $\mu$m thick silicon nitride layer 16, and trenches are then etched to a depth of about 3.0 $\mu$m and filled with tungsten to form the structures 40-43 (FIG. 4A). A 0.4 $\mu$m thick PECVD layer of amorphous silicon carbide 66 is deposited on the top surface of the nitride layer 16 and on the tops of the tungsten beams 40-43, so that the beams are partially surrounded by the nitride/carbide layer 16/66. A second mask is then used to expose the tungsten contact pads by RIE etching of layer 66, using $SF_6$, and a third, isolation mask is applied to define the dielectric hinge region 67 (FIG. 5A), and the region 68 where no dielectric is required, and the sacrificial oxide 14 is then etched. This is done with a combination of a dry RIE etch and a wet 6:1 BHF etch. An $SF_6$ anisotropic dry etch followed by a $CHF_3$ dry etch are used to define the nitride/carbide isolation hinges 60' (FIG. 6A). The top silicon carbide 66 and the sidewall silicon nitride 16 are protected during selective etching of the sacrificial silicon dioxide 14 by using a 6:1 BHF etchant. The BHF etch rate of the PECVD silicon carbide and the LPCVD silicon nitride films is small enough to sustain a long sacrificial oxide etch, after which the photoresist mask is stripped, leaving the structure of FIG. 6A.

The wafer, or substrate, is then subjected to a PECVD of $SiO_2$ to conformally coat the structures with a 3000Å layer 69 of PECVD $SiO_2$, which provides an insulating layer to prevent electrical short circuits when two beams are drawn together.

Utilizing the three-mask process described with respect to FIGS. 1 to 6, it is possible to join several different tungsten structures of various shapes and dimensions with hinge sections 60 or 68 at selected locations. Thus, the released tungsten structure can be in the form of high aspect ratio, linear beams such as those illustrated at 40 to 43, or can be in a variety of different shapes, depending on the use to which they are to be put. For example, the structure can be as simple as a pair of parallel, closely spaced beams which form capacitor plates for an actuator, or can be a complex structure such as a group of hexagons held together by silicon nitride or nitride/carbide hinges to form a released honeycomb. Thus, the fabrication process of the present invention provides design freedom not easily obtained using conventional processes for micromachining. The technology of the present invention can produce a variety of complex structures on single or multiple levels, with minimal dimension constraints, with released devices being mechanically joined and electrically isolated and constructed on any substrate.

Figure 7:
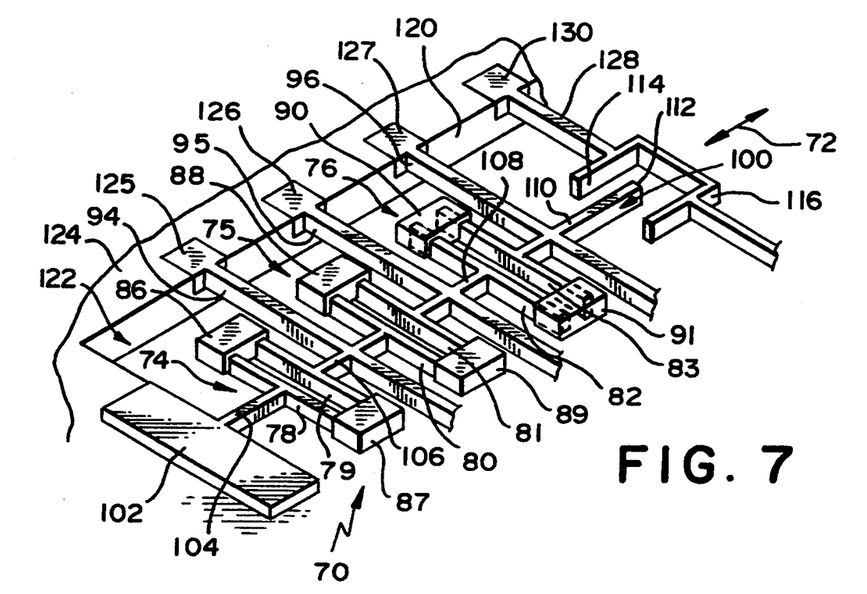
FIG. 7 is a perspective view of a first microstructure constructed in accordance with the process of FIGS. 1–6.

One example of a structure which can be fabricated by the isolation technology described in FIGS. 1 to 6 is illustrated in FIG. 7 as a series-parallel (SP) actuator generally indicated at 70, which provides controlled axial displacements in the directions of arrow 72. Three series-connected actuator units 74, 75 and 76 are illustrated, with each unit being composed of two parallel released tungsten beams. Thus, unit 74 is made up of two parallel beams 78 and 79, unit 75 is made up of parallel beams 80 and 81, and unit 76 is made up of parallel beams 82 and 83, the beams being fabricated in the manner illustrated with respect to FIGS. 1 through 6. These beams may be 100-150 $\mu$m long, 1.5 $\mu$m wide, and 3.0 $\mu$m in height, for example, with each pair of beams being spaced apart 1.5 $\mu$m, but held together at their opposite ends by means of corresponding released silicon nitride or nitride/carbide hinges corresponding to hinges 60 or 60' described above. Thus, beams 78 and 79 are held together at their opposite ends by hinges 86 and 87, beams 80 and 81 are held together by hinges 88 and 89, and beams 82 and 83 are held together by hinges 90 and 91. The silicon nitride or nitride/carbide hinges electrically isolate their respective pairs of beams while mechanically joining them, so that the two beams in each unit can be individually electrically biased.

The actuator units are biased by way of laterally extending support and biasing arms 94, 95 and 96 which are connected to an axially extending main actuator beam 100 in which the actuator units are serially connected. As illustrated in FIG. 7, beam 100 is divided into segments by the serial actuator units 74, 75 and 76 and is secured at one end to a contact pad 102. A first segment 104 of beam 100 extends between pad 102 and the beam 78, a second segment 106 extends beams 79 and 80, a third segment 108 extends between beams 81 and 82 and a fourth segment 110 extends between beam 83 and a free end portion 112 which may carry a switch, a variable impedance element, a mirror, or the like. In the illustrated embodiment, the free end 112 is in the form of a capacitive plate which extends between a pair of spaced capacitor elements 114 and 116 to provide a variable capacitance, but other configurations are available.

Contact pad 102 is connected by way of beam segment 104 to beam 78 so that the application of an electrical potential to contact 102 produces a corresponding potential on beam 78. In similar manner, the application of a potential to arm 94 produces a corresponding potential on beams 79 and 80 by way of segment 106, a potential on arm 95 produces a corresponding potential on beams 81 and 82 by way of segment 108, and a potential on arm 96 produces a potential on beam 83 as well as on capacitor plate 112. The application of potentials of selected polarity on the opposed beams of each actuator unit cause the beams to be attracted to each other or to be repelled, to thereby produce axial motion in the main actuator beam 100. If N is the number of activated units and x is the displacement produced by each unit, then the lateral displacement X is approximately equal to the product Nx. Thus, the axial displacement produced by the serial arrangement of the actuators 74-76 is the sum of the contributions of each unit. The hinges provided for each pair of opposed beams in the units 74, 75 and 76 provide mechanical and electrical isolation between the opposed pairs so that the application of a potential across them can produce the desired capacitive motion.

It is noted that the arms 94, 95 and 96 may be secured to the side wall 120 of a trench 122 formed in a wafer 124, with arms 94, 95 and 96 being connected to corresponding contact pads 125 to 127 on the wafer. In similar manner, the capacitor plates 114, 116 can be connected by means of arm 128 to a pad 130, also on the side wall 120. The arms 94, 95 and 96 are slightly flexible to accommodate the longitudinal motion of the main actuator beam 100. Each side of each individual actuator unit is connected to a corresponding contact so that the actuator units can be selectively and individually activated by suitable potentials applied to the corresponding contact pads. These potentials may be digital or analog, and can be applied to a single unit or to any number of units to allow a great deal of control over the longitudinal motion of beam 100 and thus to provide precise control of the actuator. The spacing between the beams may be in the range of about 1.5 $\mu$m, and a longitudinal displacement of 3.0 $\mu$m can be obtained, in the illustrated example of the invention, by the application of 130 volts across each pair of 100 $\mu$m long beams. If the beams are extended to, for example, 200 $\mu$m in length, an application of 45 volts produces the same longitudinal displacement. The range of displacement can be increased without a significant increase in operating voltage simply by adding more actuator units.

Figure 8:
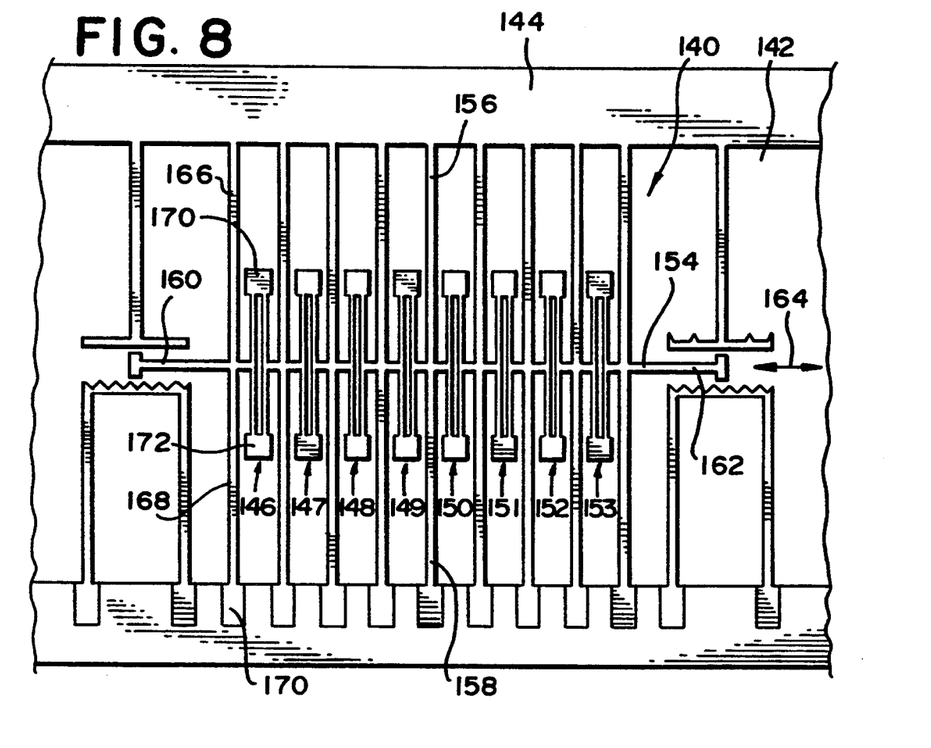
FIG. 8 is a top plan view of a second microstructure constructed in accordance with the process of FIGS. 1–6.

FIG. 8 is a top plan view of another actuator 140 located in a trench 142 formed in a wafer 144. In this embodiment, the actuator incorporates eight actuator units 146 through 153 serially mounted in an axially extending main actuator beam 154. The actuator is supported at its center by means of a pair of support arms 156 and 158, with the opposite ends 160 and 162 of beam 154 being free to move axially in the direction of arrows 164. Support and biasing arms 166, 168 are provided for each actuator, with the biasing arms being connected to corresponding contact pads 170 on the surface of wafer 144 for use in activating the individual units in the manner described with respect to FIG. 7. In this case, both free ends of the actuator are movable and controllable by selectively biasing the individual actuator units to move the free ends to produce variable impedances, switch actuation, and the like. Again, each of the actuators is fabricated by means of a pair of parallel tungsten beams supported at opposite ends by isolator hinges such as hinges 170 and 172 on actuator 146, again in the manner illustrated with respect to FIG. 7.

Figure 9:
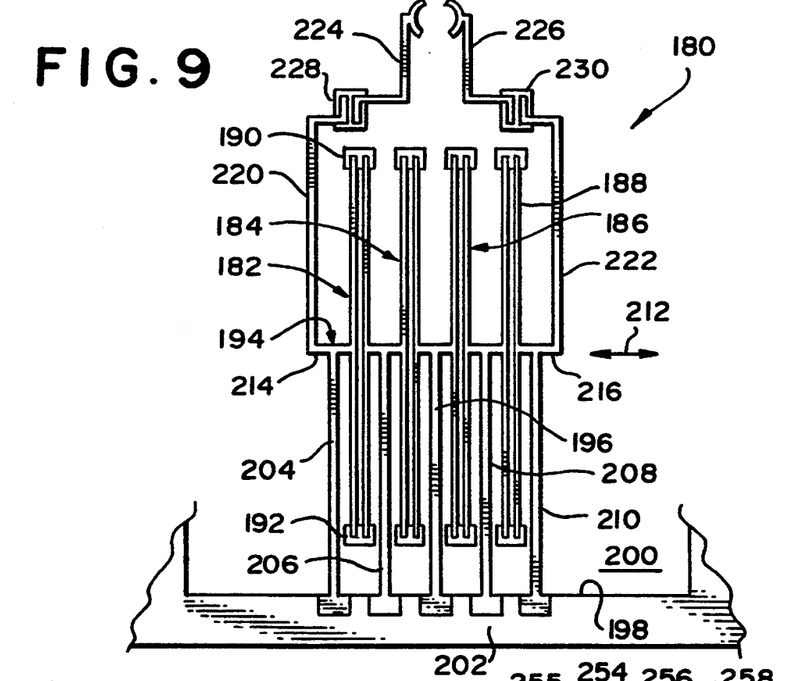
FIG. 9 is a top plan view of a third microstructure constructed in accordance with the process of FIGS. 1–6.

A further exemplary embodiment of a structure fabricated in accordance with the process of FIGS. 1 through 6 is a microtweezer or microgripper structure such as that illustrated at 180 in FIG. 9. The microtweezer structure includes, in this example, four actuator units 182, 184, 186 and 188 each constructed in the manner described above with respect to FIG. 7 and including pairs of opposed tungsten arms interconnected at their opposite ends by nitride or nitride/carbide hinges such as the hinges 190, 192 on actuator 182. Similar hinges are provided on each of the other actuators, and the actuators are mounted in series in the axially extending main actuator beam 194. A support arm 196 secures the actuator assembly to the side wall 198 of a trench 200 located in a wafer 202 so that the actuators are cantilevered above the floor of trench 200. Biasing arms 204, 206, 208 and 210 are connected to corresponding segments of the main actuator beam 194 to permit the application of biasing potentials to opposed actuator beams so that beam 194 can be extended and contracted in the direction of arrows 212.

The outer, or free ends 214 and 216 of beam 194 are connected to a pair of drive arms 220 and 222 which are released, movable tungsten beams carried by main beam 194 for motion inwardly and outwardly, again in the direction of arrows 212. The drive arms extend in the plane of the actuator units 182, 184, 186 and 188 beyond the ends of the actuators, where they are secured to a pair of corresponding gripper arms 224 and 226, respectively. The connection between arms 220 and 224 is by way of a hinge 228 which mechanically joins the arms together while electrically isolating them. In similar manner, arms 222 and 226 are mechanically joined by a hinge 230 so that the gripper arms 224 and 226 are isolated from the potentials applied to the actuator units. The gripper arms 224 and 226 thus are movable toward and away from each other to provide a controlled microtweezer action regulated by the potentials applied to the respective actuator units, the assembly 180 providing a gripping range on the order of 10 $\mu$m, in one embodiment of the invention.

Figures 10, 13:
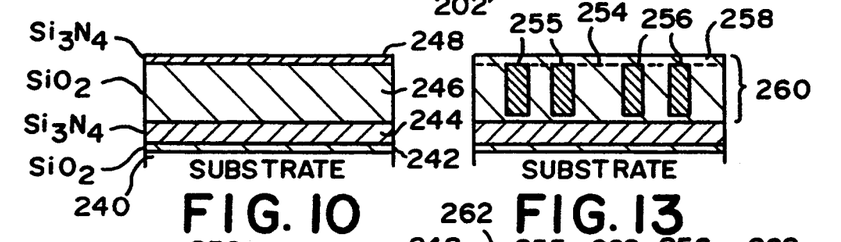
FIGS. 10–15 are diagrammatic illustrations of a second process for fabricating released, mechanically connected, electrically isolated, metal microstructures.
Figure 11:
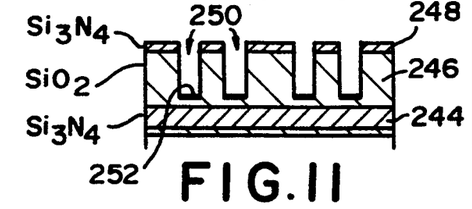

A modified form of the process of FIGS. 1 through 6 is illustrated in FIGS. 10 through 15, to which reference is now made. As illustrated in FIG. 10, the substrate material 240, which may be a silicon wafer, but which may be other materials, is covered by a layer 242 of silicon dioxide. Thereafter, nitride layer 244, silicon dioxide layer 246 and nitride layer 248 are applied in the manner described with respect to FIG. 1. As illustrated in FIG. 11, trenches 250 are then formed in the silicon dioxide in the manner described above with respect to FIG. 2, and silicon 252 is implanted in the bottoms of the trenches, again as described with respect to FIG. 2.

Figure 12:
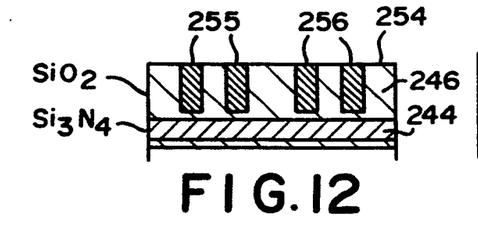

As illustrated in FIG. 12, the nitride layer 248 is removed, to expose a top surface 254 of layer 246, and the trenches 250 are filled with tungsten, which seeds on the layer 252 in each of the trenches. The tungsten forms structures 255 and 256, the top surfaces of which are level with surface 254. Thereafter silicon dioxide is deposited on surface 254 to form an additional layer 258 which extends over the tops of the tungsten structures 255 and 256, thereby surrounding these structures in a consolidated layer 260 of silicon dioxide.

Figure 14:
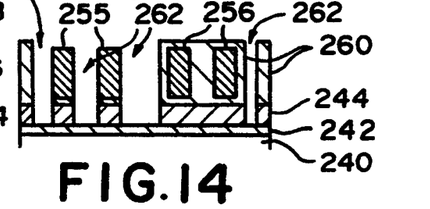

As illustrated in FIG. 14, a masking step then permits a dry RIE etch to remove the silicon dioxide layer 260 in selected regions, such as regions 262, to expose selected structures or portions of structures such as elements 255 and to leave other selected portions of the tungsten structure, as at 256, surrounded by the silicon dioxide layer 260. The nitride layer 244 in the regions 262 is then removed down to the oxide layer 242 which acts as a stop for the nitride etch process.

Figure 15:
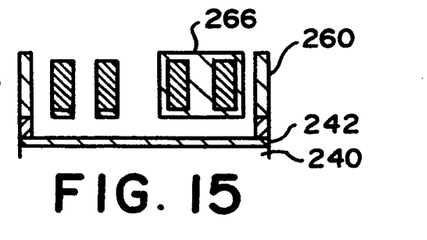

Thereafter, the tungsten structure is released by a wet chemical etch which removes the layer 244 under elements 255 and 256, providing released tungsten beams having silicon dioxide isolating hinges such as the hinge 266 at selected locations to mechanically support adjacent tungsten elements while maintaining electrical isolation therebetween.

Figure 16:
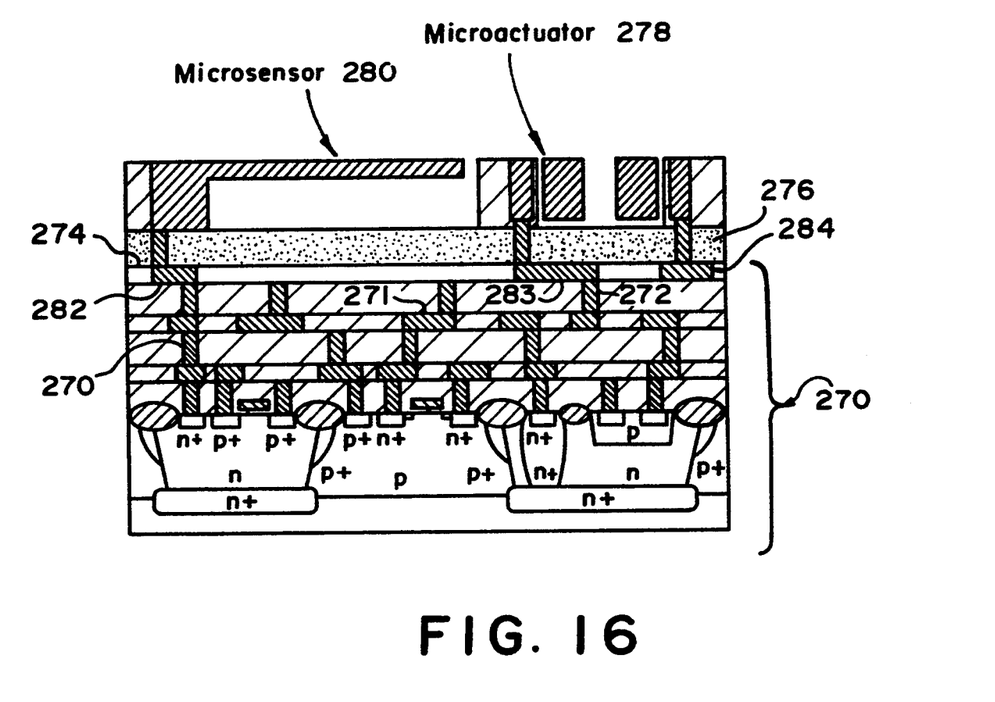
FIG. 16 is a diagrammatic illustration of microstructures fabricated by the processes of the present invention in combination with a conventional integrated circuit.

As illustrated in FIG. 16, microstructures fabricated in accordance with the present invention can be placed on existing integrated circuits such as the conventional IC chip generally indicated at 270. This chip includes a number of layers in conventional manner which are connected by means of suitable interconnects such as those illustrated, for example, at 270, 271 and 272. Such an integrated circuit typically has a planar top surface 274 onto which microactuators in accordance with the present invention can be placed. This is accomplished, in accordance with the process of FIGS. 1 through 6, by applying an insulating (nitride) layer 276 on the surface 274 and thereafter fabricating tungsten structures such as the microactuator 278 or the microsensor 280 in the manner described above. As described with respect to FIG. 4, a resist mask is utilized in the process for etching the insulating layer 276 to provide apertures, or vias, to corresponding pads, such as pads 282, 283 and 284 in the integrated circuit. This permits the formation of interconnects through the vias to the corresponding microstructure for connection of the structure to the integrated circuit for use in applying suitable control potentials to the structure.

Figure 17:
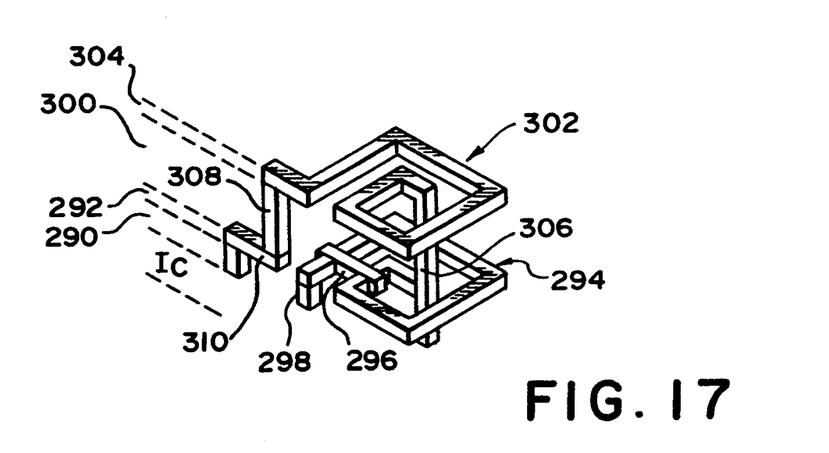
FIG. 17 is a diagrammatic illustration of a fourth microstructure constructed in accordance with the processes of the present invention.

Since the process of the present invention is a planar process, the tungsten structures can be fabricated in several layers, with the release step being the last one so that the layers can be interconnected. Thus, for example, as illustrated in FIG. 17, a first layer diagrammatically illustrated at 290 may be an insulating layer of silicon dioxide or nitride through which vias extend for connection of the tungsten structures to underlying circuits in an integrated circuit wafer. In a second layer 292, a tungsten structure 294 of any desired shape, but illustrated as an inductor coil, is fabricated in the manner described above with respect to FIGS. 1 through 6 or, if desired, with respect to FIGS. 10 through 15. Suitable nitride oxide or nitride/carbide hinges 296 may extend between adjacent tungsten beams, as required, to provide mechanical support and electrical isolation therebetween. As noted, one end of the inductor device 294 may be connected to an interconnect 298 extending, for example, through a via in layer 290.

The tungsten structure in layer 292 can then be planarized, as by a dielectric layer 300, and a second structure 302 formed in a layer 304, again in the manner described above. The structure 302 may be a second inductor coil located above the first inductor 294. This inductor may also include suitable isolating and support hinges (not shown) and may be connected to the first inductor 294 by way of an interconnect 306 extending through a via in layer 300. Interconnect 306 may also extend through a corresponding via in layer 290, if desired, for connection of one end of each inductor to a common circuit element in the underlying integrated circuit. The opposite end of inductor 302 may be connected through an interconnect 308 to a contact pad 310 in layer 292 which may, in turn, be connected through a corresponding via in layer 290 to the underlying integrated circuit. Thereafter, the two structures can be released for electrical and mechanical isolation. The two inductor coils may be sufficiently close together to form a transformer of very small dimensions which can be connected into the underlying integrated circuit. Furthermore, if desired, adjacent structures can be provided to produce a capacitive relationship with either structure 294 or structure 302, or both, to provide relative motion of the released structures to vary the inductance between the two inductor devices.

Figure 18:
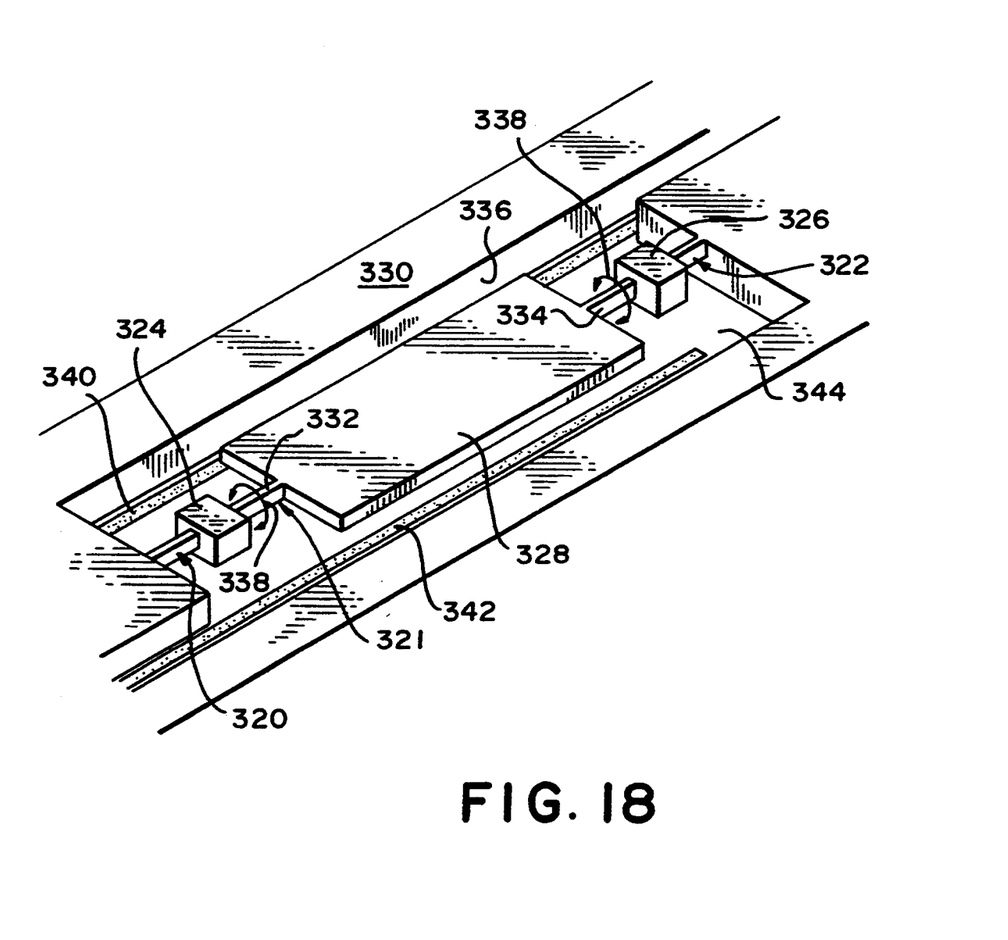
FIG. 18 is a diagrammatic illustration of a fifth microstructure constructed in accordance with the present invention.

FIG. 18 illustrates another structure which can be fabricated in accordance with the process of FIGS. 1-6. In this device, instead of fabricating parallel beams in the manner described above, plural spaced tungsten beams 320, 321 and 322 are fabricated end-to-end and are joined by hinges 324 and 326 to form an elongated rod having segments which are electrically and thermally isolated from each other. Such a structure can advantageously be constructed in such a way as to allow torsional rotation out of the plane of the substrate. As an example, beam 31 is shaped to have a flat panel portion 328 which is generally in the plane of the surrounding substrate 330. The beam includes two end segments 332 and 334 which are axially aligned with each other to define an axis of rotation for the panel. The panel 328 and segments 332 and 334 are fabricated in the manner described with respect to FIGS. 1-6 in a surrounding trench 336.

At the same time that segment 321 is fabricated, connector beams 320 and 332 are also fabricated in axial alignment with segments 332 and 334, but are axially spaced therefrom. The beams 320 and 322 are joined to segments 332 and 334, respectively, by hinges 324 and 326, also by the process of FIGS. 1-6. The hinges secure the panel to the surrounding substrate by way of beams 320 and 322, but at the same time thermally and electrically isolate the panel. The beams 320 and 322 and segments 332 and 334 are dimensioned to be sufficiently flexible to allow torsional motion of the plate 328 in the direction of arrows 338.

Motion in plate 328 is produced by electrodes 340 and 342 fabricated on the floor 334 of trench 336. Such electrodes are fabricated, for example, after release of the beams 320-322 by masking as required and depositing metal on floor 344.

The plate 328 may be mechanically or chemically polished after the tungsten deposition step in. FIG. 3, as discussed above, so that a highly polished mirror surface is provided.

Although the present invention has been described in terms of preferred embodiments, numerous modification and variations can be made without departing from the invention. For example, the tungsten structure described herein is fabricated in such a way as to extend over a ceramic material such as silicon dioxide or nitride, which material is not only electrically insulating but is thermally insulating. Therefore, the tungsten structure can be connected to suitable electrical circuitry for use as an incandescent source of light, the underlying insulating material serving as a heat barrier to protect underlying structures or circuits. Furthermore, although the substrate underlying the device may be a silicon wafer which may incorporate integrated circuits compatible with the tungsten material, it will be apparent that microstructures can be fabricated on any suitable surface such as glass, for example.

There are essentially no dimensional constraints on the tungsten structure described herein, and the beams thus can be any desired thickness (apart from mechanical stress considerations) and spaced apart by any desired distance, while still being mechanically connected by insulating hinges. It will be apparent that other CVD metals or polysilicon can be used to fabricate the various structures described herein, for a primary feature of the invention is the provision of insulating hinges which mechanically support adjacent structures while electrically insulating them. However, since tungsten is compatible with conventional integrated circuits, it is preferred. Additional features and modifications of the invention will become apparent to those of skill in the art, and accordingly the true spirit and scope of the invention is limited only by the following claims.

What is claimed is:

1. A microstructure having electrically isolated, mechanically interconnected movable beams, comprising:
   a support including a cavity;
   at least first and second released metal beams in said cavity and mounted to said support; and
   dielectric isolator means mechanically joining and electrically insulating selected portions of said metal beams.

2. The microstructure of claim 1, wherein said metal beams are tungsten.

3. The microstructure of claim 2, wherein said dielectric isolator means is nitride.

4. The microstructure of claim 2, wherein said dielectric isolator means is silicon dioxide.

5. The microstructure of claim 1, further including metal support and bias arms extending from said metal beams to said support for mechanically securing said metal beams and for supplying electrical potential to selected metal beams.

6. The microstructure of claim 5, wherein said support includes an integrated circuit wafer having contact means for connection to said metal bias arms.

7. The microstructure of claim 5 wherein said support includes a dielectric stack.

8. The microstructure of claim 7 wherein said support further includes a substrate supporting said dielectric stack.

9. The microstructure of claim 5, wherein said microstructure includes multiple released metal beams in said cavity.

10. The microstructure of claim 5, wherein said metal beams are fabricated on plural levels within said cavity.

11. The microstructure of claim 9 wherein said microstructure includes multiple sets of coextensive parallel metal beams and electrically insulating hinge means mechanically interconnecting metal beams in said sets, said metal bias arms supplying electrical potentials across beams in each said set.

12. The microstructure of claim 11, wherein said sets of metal beams are mounted in series in a metal, released, axial, main beam, said sets dividing said metal main beam into axial segments extending between adjacent sets, said released metal beams in said sets being relatively movable whereby electrical potentials supplied to said sets of metal beams produce axial motion of said main beam.

13. The microstructure of claim 12, further including metal driver arms connected to said main beam to produce a micromechanical gripper.

14. The microstructure of claim 9, wherein said metal beams comprise a first inductor fabricated on a first level within said cavity, and a second inductor fabricated on a second level within said cavity.

15. The microstructure of claim 14 wherein said first and second inductors are electrically connected to form a transformer.

16. The microstructure of claim 9, wherein said multiple beams are in axial, end-to-end spaced alignment and are joined end to end by said hinges.

17. The microstructure of claim 16, wherein at least one of said beams is a reflective panel.

18. The microstructure of claim 17, further including means for rotating said panel about an axis defined by said end-to-end beams.

19. A microstructure having electrically isolated, mechanically interconnected movable metal beams, comprising:
a support layer;
a cavity formed in said layer, said layer forming walls surrounding said cavity;
first and second metal beams located in said cavity, said beams being released from and thereby mechanically spaced from and movable with respect to said layer;
a dielectric isolator hinge mechanically joining said first and second beams but electrically insulating said beams from each other; and
beam support means connected between one of said first and second beams and said layer for mounting said first and second beams in said cavity.

20. The microstructure of claim 19, further including a second dielectric isolator in said beam support means to electrically isolate said first and second beams from said layer.

21. The microstructure of claim 19, wherein said first and second beams are parallel to each other, said beams each having first and second ends respectively interconnected by first and second dielectric isolator hinges.

22. The microstructure of claim 21, wherein said beam support means comprises an axial beam having first and second aligned segments connected to said first and second beams, respectively, said axial beam being generally perpendicular to first and second beams.

23. The microstructure of claim 22, wherein said beam support means further includes support arms extending from said axial beam to said layer.

24. The microstructure of claim 23, wherein said axial beam includes at least one free end for supporting an element to be mechanically moved by relative motion of said first and second beams.

25. A microstructure having electrically isolated, mechanically interconnected movable metal beams, comprising:
a support layer;
a cavity in said layer;
a first metal beam located in a first plane within said cavity;
a second metal beam located in a second plane within said cavity and spaced below and in vertical alignment with said first beam, said first and second beams being curved to form parallel induction coils, said first and second beams being released for mechanical and electrical isolation from said layer; and
support means mounting said beams in said cavity.

26. A microstructure having an electrically isolated, mechanically interconnected movable metal beam, comprising:
a support layer;
a cavity formed in said layer, said layer forming walls surrounding said cavity;
first, second, and third axially aligned metal beam segments, said first and second beam segments being mounted to said layer;
first and second dielectric hinges mechanically interposed between said first and third and between said second and third beam segments, respectively, to electrically isolate said third segment from said first and second segments and from said layer; and
means on said layer adjacent said third segment for producing torsional motion in said third segment with respect to said first and second segments.

* * * * *